(12) United States Patent
Suh

(10) Patent No.: US 7,372,680 B2
(45) Date of Patent: May 13, 2008

(54) ELECTROMAGNETIC FIELD PREVENTING AND PROTECTING CIRCUIT OF ORGANIC ELECTROLUMINESCENT DISPLAY DEVICE HAVING A SEPARATED STRUCTURE

(75) Inventor: Mi-Sook Suh, Yongin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 426 days.

(21) Appl. No.: 10/972,056

(22) Filed: Oct. 22, 2004

(65) Prior Publication Data

US 2005/0135027 A1   Jun. 23, 2005

(30) Foreign Application Priority Data

Nov. 3, 2003   (KR) .................... 10-2003-0077423

(51) Int. Cl.
*G02F 1/1333* (2006.01)
(52) U.S. Cl. ........................................ 361/56; 349/40
(58) Field of Classification Search ............ 361/56–58, 361/111; 349/40; 257/666, 678
See application file for complete search history.

(56) References Cited

U.S. PATENT DOCUMENTS

| | | | | |
|---|---|---|---|---|
| 5,313,319 A | * | 5/1994 | Salisbury | ..................... 349/40 |
| 5,760,855 A | * | 6/1998 | Nakase et al. | ................. 349/40 |
| 5,949,502 A | * | 9/1999 | Matsunaga et al. | ............ 349/40 |
| 5,969,411 A | * | 10/1999 | Fukaya | ....................... 257/666 |
| 6,084,648 A | * | 7/2000 | Yeo | ............................... 349/40 |
| 2006/0128173 A1 | * | 6/2006 | Chang | .......................... 439/63 |

* cited by examiner

*Primary Examiner*—Michael Sherry
*Assistant Examiner*—Danny Nguyen
(74) *Attorney, Agent, or Firm*—Christie, Parker & Hale, LLP

(57) ABSTRACT

A display device having an electromagnetic field preventing and protecting circuit having a separated structure for enabling easy repairing in case abnormal characteristics are generated by static electricity at electrostatic prevention circuit for protecting the display device from static electricity. An electromagnetic field preventing and protecting circuit of a display device includes a separated structure in a charge input line which couples an input terminal of a power supply voltage line or a cathode supply voltage line to the electromagnetic field preventing and protecting circuit. The separated structure is formed such that the electromagnetic field preventing and protecting circuit can be easily separated The separated structure may include a circuit separation part having a narrower width compared to the rest of the charge input line, and the electromagnetic field preventing and protecting circuit may include a diode ring.

21 Claims, 4 Drawing Sheets

ELECTROMAGNETIC FIELD PREVENTING AND PROTECTING CIRCUIT OF ORGANIC ELECTROLUMINESCENT DISPLAY DEVICE HAVING A SEPARATED STRUCTURE

CROSS REFERENCE TO RELATED APPLICATION

This application claims priority to and the benefit of Korean Patent Application No. 2003-77423, filed on Nov. 3, 2003, the disclosure of which is incorporated herein by reference in its entirety.

BACKGROUND OF THE INVENTION

1. Field of the Invention

The present invention relates to an organic electroluminescent display device, and more particularly, to an electromagnetic field preventing and protecting circuit of an organic electroluminescent display device having a separated structure for enabling easy repairing in case abnormal characteristics are generated at an electrostatic preventing circuit for protecting the organic electroluminescent display device from static electricity.

2. Description of Related Art

The organic electroluminescent display device is exposed to electrostatic discharge having high instantaneous voltage by various causes. Since gate insulation film breakage or junction sparking of metal oxide semiconductor (MOS) electric field effect transistor device inside semiconductor device is generated in such cases, the device is completely broken or subtly damaged so that reliability of the device is severely influenced. Therefore, it is considerably important to prevent the gate insulation film breakage or junction sparking in the development stage of the organic electroluminescent display device.

In order to prevent this problem, an electromagnetic field preventing and protecting circuit is used. In the electromagnetic field preventing and protecting circuit, it has been suggested to use a diode ring for preventing damage of internal circuits by connecting a diode between signal lines and power lines.

FIG. 1 is a plan view of an ordinary organic electroluminescent display device.

As illustrated in FIG. 1, an organic electroluminescent display device 100 includes a pixel region 160 having a central part which includes a plurality of unit pixels, such that the pixel region 160 is emitted according to signals applied. The organic electroluminescent display device 100 also includes an upper power supply voltage line 110 wired above the pixel region 160 to apply power supply voltage, and a lower power supply voltage line 130 wired below the pixel region 160 to apply power supply voltage. Further, the organic electroluminescent display device 100 includes a cathode voltage line 120 positioned at one side of the pixel region 160 to apply cathode voltage, a scan driver 140 positioned at the other side of the pixel region 160 to output selection signals, and a data driver 150 formed below the lower power supply voltage line 130 to apply data signals to the pixel region 160.

In the organic electroluminescent display device 100, a power supply voltage is applied to the pixel region 160 from the upper power supply voltage line 110 and the lower power supply voltage line 130, and a cathode voltage is applied to the pixel region 160 from the cathode voltage line 120. When the selection signals and the data signals are applied from the scan driver 140 and data driver 150, respectively, driving circuits formed at unit pixels are switched on so that currents corresponding to the power supply voltage and the data signals are applied to organic EL devices (not illustrated) respectively formed at the unit pixels to display a certain image on the pixel region 160.

As illustrated in FIG. 2, the organic electroluminescent display device 100 includes an electromagnetic field preventing and protecting circuit for controlling characteristics of the electrostatic charges of both sides by discharging the electrostatic charges of one side of the input terminal to the other side of the input terminal when there is something wrong with characteristics of signals applied to respective constituents at an input end of the respective power supply lines 110, 130, for example, if electrostatic charges are generated from one side of the input terminal. Referring back to FIG. 1, a diode ring is coupled between input terminals of the power supply voltage line 110 as shown in circle A.

FIG. 2 is a conventional electromagnetic field preventing and protecting circuit using a diode ring.

An input terminal having sides 170, 170' is an input terminal of respective power supply lines of the organic electroluminescent display device for receiving input from external devices. A diode ring 180 discharges static electricity transferred through the input terminal 170, 170', and charge input lines 181, 181' each have a certain width and transfers static electricity generated from the input terminal 170, 170' to the diode ring 180, which is formed by diode-connecting a plurality of thin film transistors.

As illustrated in FIG. 2, the charge input lines 181, 181' are formed, respectively, at an upper side and a lower side of a conventional electromagnetic field preventing and protecting diode ring in such a way that the conventional electromagnetic field preventing and protecting diode ring is connected to the input terminal 170, 170'. The charge input lines 181, 181' each have a certain width in such a way that the charge input lines 181, 181' are connected to the input terminal 170, 170', and the charge input lines 181, 181' are bent at a certain length of the charge input lines 181, 181', respectively, so that the bent charge input lines 181, 181' are connected to the diode ring 180 to transfer static electricity generated from the input terminal 170, 170' to the diode ring 180.

Charges of one side and the other side of the input terminal are controlled by discharging characteristic signals except for difference of voltage corresponding to the sum total of characteristic signals transmitted through the charge input lines 181, 181' and the threshold voltages of a plurality of thin film transistors to the other side of the input terminal since the diode ring 180 is formed by diode-connecting a plurality of thin film transistors as illustrated the above. That is, charges of both sides of the input terminal are controlled by transferring the charges from one side of the input terminal having higher charges to the other side of the input terminal having lower charges.

When the conventional electromagnetic field preventing and protecting diode ring is damaged due to high voltage caused by static electricity in the internal structure, the diode ring is separated from the input terminal by applying a laser to the charge input line. However, there is a problem that it takes a long period of time to perform replacement operation of the electromagnetic field preventing and protecting circuit because the width of the charge input line is wider than the diameter of the laser beam so that the application time of the laser beam is lengthened.

SUMMARY OF THE INVENTION

In one exemplary embodiment according to the present invention, is provided a display device, such as an organic electroluminescent display device, including an electromagnetic field preventing and protecting circuit coupled to a separated structure such that a diode ring can be easily separated for repairing when there is something wrong with characteristics of the diode ring. The separated structure is realized by forming a circuit separation part having a neck whose width is narrowed at a certain part of the charge input line for coupling the input terminal to the electromagnetic field preventing and protecting circuit.

In an exemplary embodiment according to the present invention, a display device includes a pixel region, a power supply voltage line for providing a power supply voltage to the pixel region, and a cathode supply voltage line for providing a cathode voltage to the pixel region. The display device also includes an electromagnetic field preventing and protecting circuit coupled to an input terminal of the power supply voltage line or the cathode supply voltage line to discharge signals having abnormal characteristics, and a charge input line for coupling the electromagnetic field preventing and protecting circuit to the input terminal. The charge input line has a separated structure formed such that the electromagnetic field preventing and protecting circuit can be easily separated from the input terminal. The separated structure may include a circuit separation part having a narrower width compared to the rest of the charge input line. The charge input line may further include an edge part formed in an obtuse angle or an acute angle between the input terminal and the electromagnetic field preventing and protecting circuit to couple the charge input line to the electromagnetic field preventing and protecting circuit. The electromagnetic field preventing and protecting circuit may include a diode ring. The display device may be an organic electroluminescent display device.

In another exemplary embodiment according to the present invention, a display device includes a pixel region, a power supply voltage line for providing a power supply voltage to the pixel region, and a cathode supply voltage line for providing a cathode voltage to the pixel region. The display device also includes an electromagnetic field preventing and protecting circuit coupled to an input terminal of the power supply voltage line or the cathode supply voltage line to discharge signals having abnormal characteristics, and a circuit separation part for coupling the electromagnetic field preventing and protecting circuit to the input terminal. The circuit separation part has a width that is less in magnitude than a diameter of a laser beam used for repairing the electromagnetic field preventing and protecting circuit. The circuit separation part may be formed as a neck having the width that is less in magnitude than the diameter of the laser beam. The circuit separation part may be formed at a charge input line for coupling the electromagnetic field preventing and protecting circuit to the input terminal. The electromagnetic field preventing and protecting circuit may include a diode ring. The display device may be an organic electroluminescent display device.

In yet another exemplary embodiment according to the present invention, a display device includes a pixel region, a power supply voltage line for providing a power supply voltage to the pixel region, and a cathode supply voltage line for providing a cathode voltage to the pixel region. The display device also includes an electromagnetic field preventing and protecting circuit coupled to an input terminal of the power supply voltage line or the cathode supply voltage line to discharge signals having abnormal characteristics, and a circuit separation part for coupling the electromagnetic field preventing and protecting circuit to the input terminal. The circuit separation part has a width that is substantially the same as a diameter of a laser beam used for repairing the electromagnetic field preventing and protecting circuit. The circuit separation part may be formed as a neck having the width that is the same as the diameter of the laser beam. The electromagnetic field preventing and protecting circuit may include a diode ring. The display device may be an organic electroluminescent display device.

In yet another exemplary embodiment of the present invention, a display device includes a pixel region, a power supply voltage line for providing a power supply voltage to the pixel region, a cathode supply voltage line for providing a cathode voltage to the pixel region, and a signal line for transmitting data signals to the pixel region. The display device also includes an electromagnetic field preventing and protecting circuit coupled to an input terminal of the power supply voltage line, the cathode supply voltage line or the signal line to discharge charges accumulated on the input terminal, and a charge input line for coupling the electromagnetic field preventing and protecting circuit to the input terminal. The charge input line has a circuit separation part having a width narrower than that of the rest of the charge input line.

BRIEF DESCRIPTION OF THE DRAWINGS

The above and other features of the present invention will become more apparent to those of ordinary skill in the art with the following description in detail of certain exemplary embodiments thereof, with reference to the attached drawings in which.

DETAILED DESCRIPTION

The present invention will now be described in detail in connection with certain exemplary embodiments with reference to the accompanying drawings.

Figure 1:
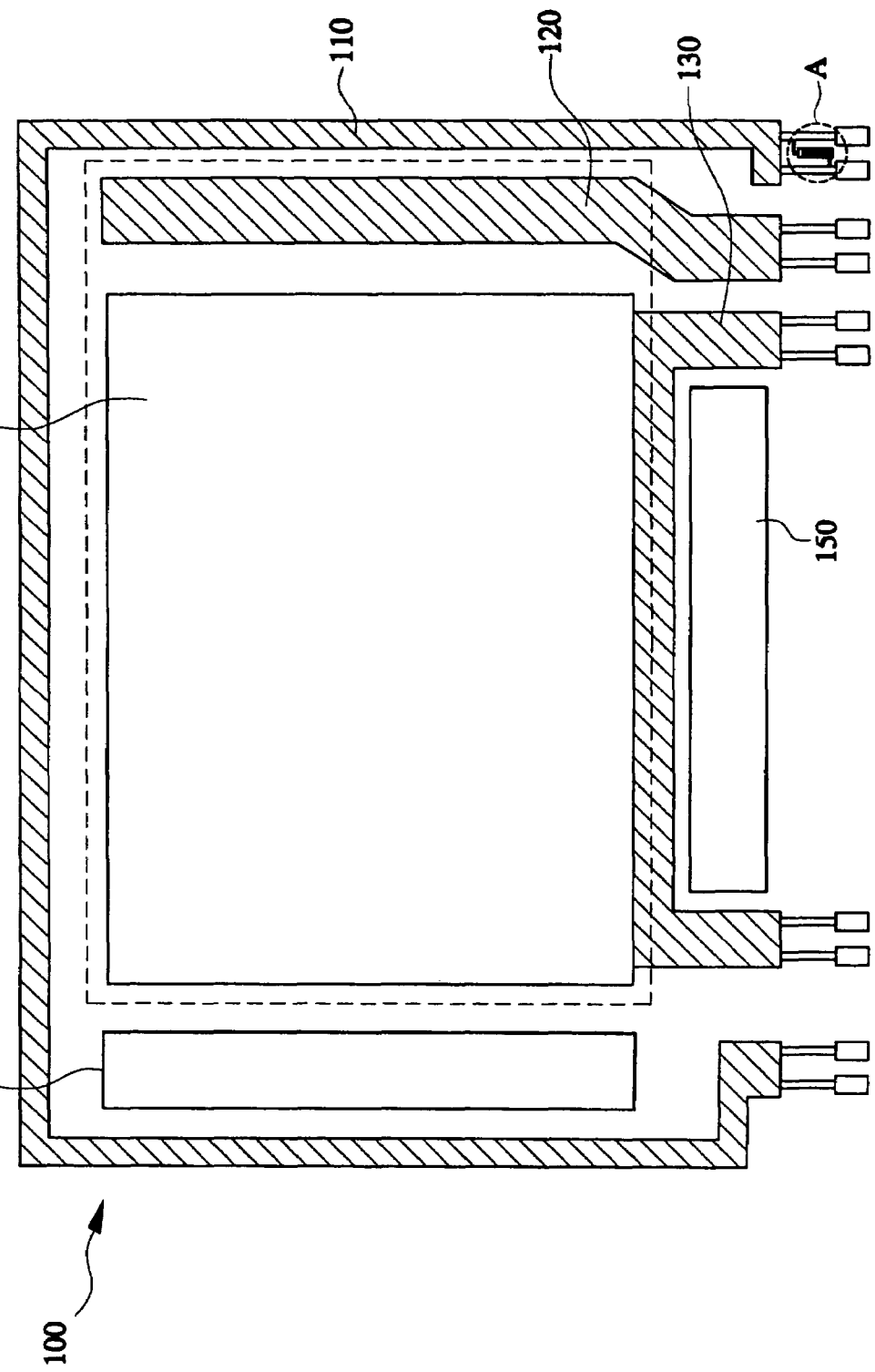
FIG. 1 is a plan view of an ordinary organic electroluminescent display device.
Figure 2:
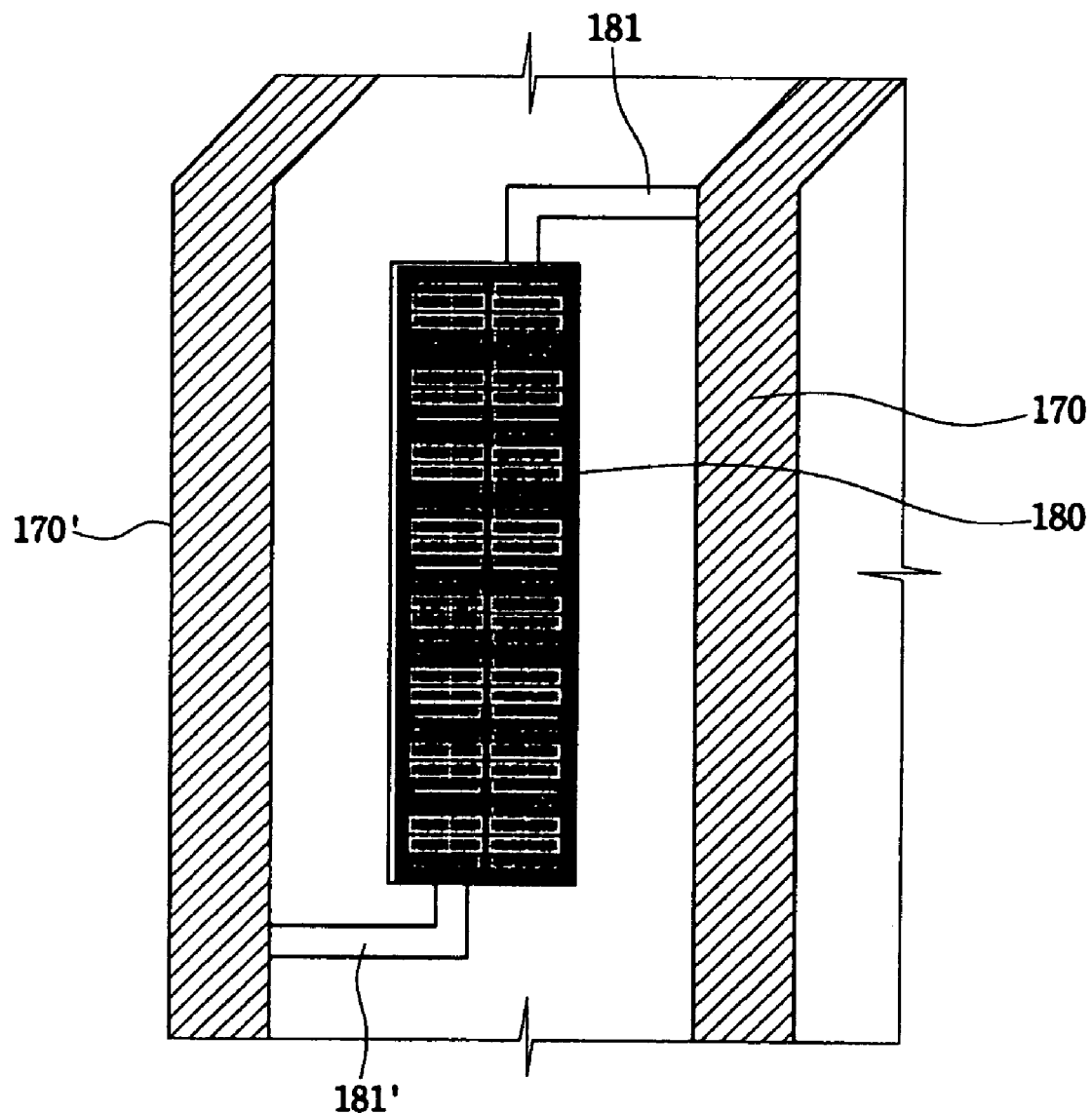
FIG. 2 is a plan view for showing a conventional electromagnetic field preventing and protecting circuit.
Figure 3:
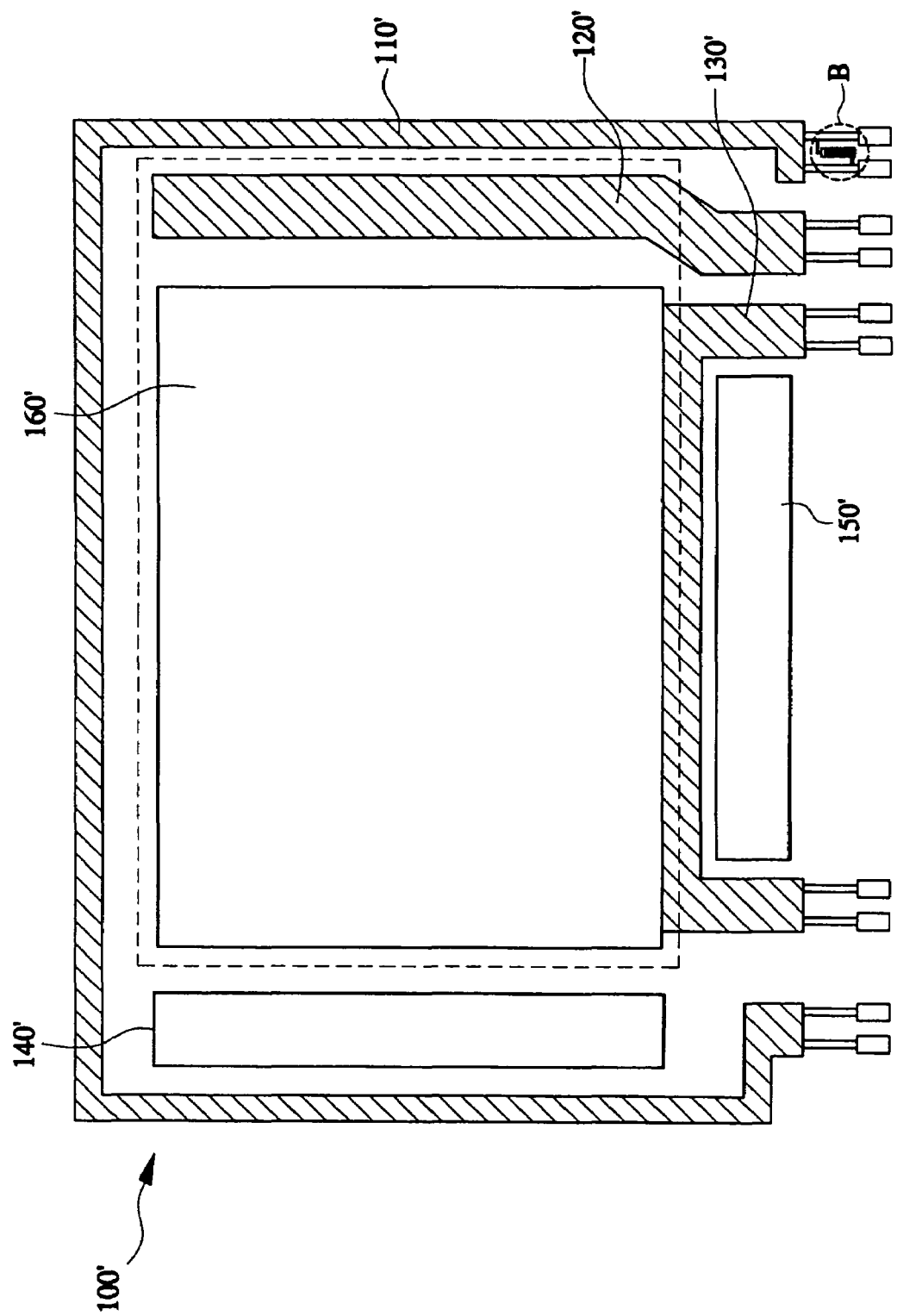
FIG. 3 is a plan view of an organic electroluminescent display device according to an exemplary embodiment of the present invention.
Figure 4:
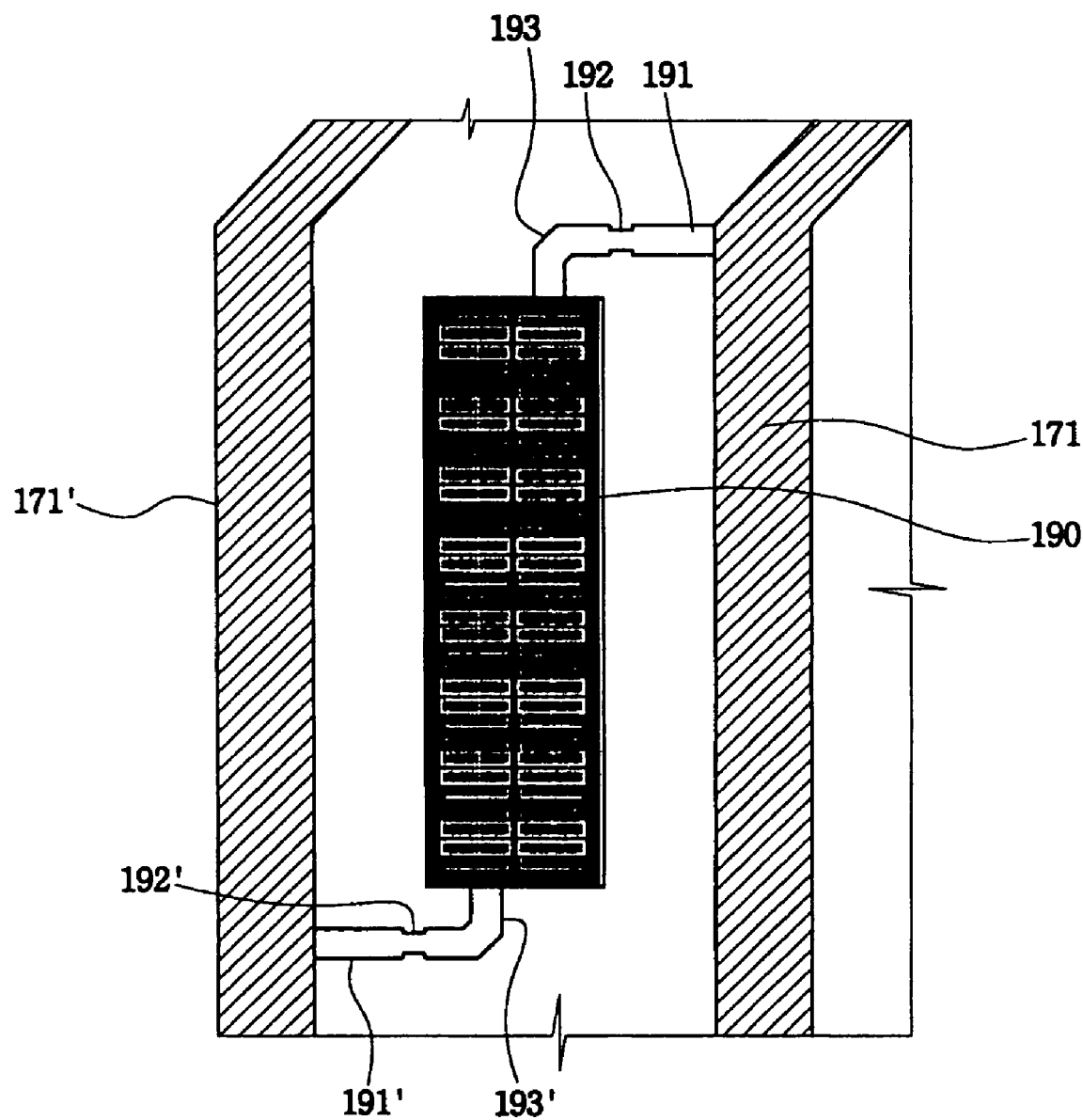
FIG. 4 is a plan view of an electromagnetic field preventing and protecting circuit having a separated structure of the organic electroluminescent display device of FIG. 3.

An organic electroluminescent display device 100' of FIG. 3 includes an upper power supply voltage line 110', a cathode voltage line 120', a lower power supply voltage line 130', a scan driver 140', a data driver 150' and a pixel region 160' that have substantially the same functions and are interconnected in substantially the same manner as the corresponding elements of the organic electroluminescent display device 100 of FIG. 1. FIG. 4 illustrates a portion of an organic electroluminescent display device having an input terminal with sides 171, 171', a diode ring 190, charge input lines 191, 191', circuit separation parts 192, 192' and edge parts 193, 193'. The circuit separation parts 192, 192' and the edge parts 193, 193', while designated separately, can be considered respectively as parts of the charge input lines 191, 191'. The input terminal may be an input terminal to any suitable one of the power supply lines (e.g., the power supply voltage line 110' or 130' or the cathode voltage line 120') and input lines (e.g., an input line between the data driver 150' and the pixel region 160') of the organic electroluminescent display device 100' of FIG. 3. Referring back to FIG. 3, for example, a diode ring is coupled between input terminals of the power supply voltage line 110' as shown in circle B. Of course, the diode ring 190 of FIG. 4 may correspond to the diode ring in circle B of FIG. 3 or to a diode ring coupled to the input terminal of any other power supply lines or input lines of the organic electroluminescent display device 100'.

By way of example, when an input signal is transmitted to the input terminal 171, 171' by a power supply line or a signal line, the diode ring 190 prevents damage of inner circuits by electrostatic discharge (ESD) because the charge input line 191, 191' transfers static electricity generated from the input terminal 171, 171' to the diode ring 190. A laser for repair is applied to the circuit separation part 192 and/or 192' when the diode ring 190 is damaged, so that the circuit separation part 192 and/or 192' is cut. The edge parts 193, 193' are bent to a certain angle so that the bent edge parts are respectively connected between the charge input line 191 and the diode ring 190, and the charge input line 191' and the diode ring 190.

By way of example, the diameter of the laser beam may be between 10 μm to 20 μm, which can be varied depending on the type of the laser used and/or based on the beam adjustment. Further, the width of the circuit separation part 192, 192' may be between 4 μm to 20 μm, such as, for example, approximately 15 μm. While the width of one or both of the circuit separation parts 192, 192' may be increased, for example, to approximately 50 μm or wider, when the width is over 20 μm, two or more applications of the laser beam (e.g., having a diameter of 20 μm or less) may be required for completely cutting the circuit separation part.

As illustrated in FIG. 4, the charge input lines 191, 191' are respectively connected to the input terminal 171, 171' at upper and lower sides of the diode ring 190. In other words, the charge input line 191 is coupled between the first side 171 of the input terminal and the upper side of the diode ring 190, and the charge input line 191' is coupled between the second side 171' of the input terminal and the lower side of the diode ring 190.

The charge input line 191 includes an edge part 193 bent between the first side 171 of the input terminal and the diode ring 190, and a circuit separation part 192 having a neck shape whose width is narrowed between the edge part 193 and the first side 171 of the input terminal. In other words, the circuit separation part 192 appear as having indentations (or cutouts) on both sides that make its width narrower than the width of the rest of the charge input line 191. In other embodiments, the width can be narrowed by making an indentation or a cutout on only one side of the charge input line to form a circuit separation part.

Similarly, the charge input line 191' includes an edge part 193' bent between the second side 171' and the diode ring 190. Further, the circuit separation part 192' has a neck shape whose width is narrowed between the edge part 193' and the second side 171' of the input terminal.

For example, if static electricity is generated at one side of both sides 171, 171' of the input terminal to which the diode ring 190 is connected, the static electricity is discharged from a side of the input terminal having higher static electricity to a side of the input terminal having lower static electricity through the diode ring 190 so that charges on both sides of the input terminal are controlled. That is, the static electricity is applied to the diode ring 190 through the charge input lines 191, 191' of the diode ring 190, and the diode ring 190 transfers the remaining voltage obtained by subtracting the total sum of the threshold voltages of the thin film transistors forming the diode ring 190 from the static electricity applied to the diode ring 190 to the other side of the input terminal so that static electricity of one side of the input terminal is discharged.

The diode ring 190 is separated from a main body of the organic electroluminescent display device by applying laser to one or both the circuit separation parts 192, 192' formed respectively at the charge input lines 191, 191' during controlling of characteristics of both sides through the diode ring 190, for example, in case that there is something wrong with the diode ring 190 as an instantaneous high voltage is being generated by static electricity. The circuit separation parts may be formed respectively between the charge input lines and the edge parts at the entrance of the charge input lines 191, 191' or formed between the main body of the diode ring 190 and the edge parts, wherein the circuit separation parts have a narrower width than the charge input lines. In detail, the circuit separation part is formed in such a neck shape that a certain length of the charge input line is narrower than width of the charge input line. That is, if W1 is width of an ordinary electric conductor, e.g., charge input line or signal and power supply lines, and W2 is width of the circuit separation part, a numerical formula is represented as W1>W2. The width W2 of the circuit separation part may, for example, be between 4 μm to 20 μm, such as, for example, approximately 15 μm.

In addition, the laser beam should have a diameter that is close to the width of the application point formed at the circuit separation parts 192, 192'. In other words, the width of the circuit separation parts should be substantially the same as or less than the diameter of the laser beam when the laser is applied to the circuit separation parts 192, 192'.

Therefore, the diode ring 190 is separated in electromagnetic field preventing and protecting circuit of an organic electroluminescent display device according to the present invention by aiming laser for repair at the circuit separation parts and applying the laser to the circuit separation parts when the diode ring 190 has been damaged due to abnormal characteristics as the circuit separation parts 192, 192' are formed in a neck shape whose width is substantially the same as or less than the diameter of the laser beam. The electromagnetic field preventing and protecting circuit of an organic electroluminescent display device according to the present invention shortens repairing time compared to electromagnetic field preventing and protecting circuit of a conventional organic electroluminescent display device since the circuit separation parts of the electromagnetic field preventing and protecting circuit of an organic electroluminescent display device according to the present invention have width that is substantially the same as or less than the diameter of the laser beam as described above.

The above described electromagnetic field preventing and protecting circuit of an organic electroluminescent display device in exemplary embodiments according to the present invention allows an easy performance of replacement work of the diode ring for repairing the damaged diode ring. Further, such electromagnetic field preventing and protecting circuit shortens working time when the diode ring is damaged due to abnormal characteristics as the circuit separation parts having a width that is substantially the same as or less than the diameter of the laser beam are formed respectively at the charge input lines of the electromagnetic field preventing and protecting circuit. In other embodiments, of course, only one of the upper and lower charge input lines between the sides of the input terminal may have a circuit separation part having a narrower width.

While the invention has been particularly shown and described with reference to certain exemplary embodiments thereof, it will be understood by those skilled in the art that the foregoing and other changes in form and details may be made therein without departing from the spirit or scope of the present invention. The scope of the present invention is indicated by the appended claims, and all changes that come within the meaning and range of equivalents thereof are intended to be embraced therein.

What is claimed is:

1. A display device comprising:
    a pixel region;
    a power supply voltage line for providing a power supply voltage to the pixel region;
    a cathode supply voltage line for providing a cathode voltage to the pixel region;
    an electromagnetic field preventing and protecting circuit coupled to an input terminal of the power supply voltage line or the cathode supply voltage line to discharge signals having abnormal characteristics; and
    a charge input line for coupling the electromagnetic field preventing and protecting circuit to the input terminal, the charge input line having a separated structure formed to facilitate electrical isolation of the electromagnetic field preventing and protecting circuit from the input terminal, the separated structure including a circuit separation part having a width equal to or smaller than a diameter of a laser beam used to electrically isolate the electromagnetic field preventing and protecting circuit from the input terminal.

2. The display device according to claim 1, wherein the width of the circuit separation part is smaller than a width of the rest of the charge input line.

3. The display device according to claim 1, wherein the charge input line further comprises an edge part formed in an obtuse angle or an acute angle between the input terminal and the electromagnetic field preventing and protecting circuit to couple the charge input line to the electromagnetic field preventing and protecting circuit.

4. The display device according to claim 1, wherein the electromagnetic field preventing and protecting circuit includes a diode ring.

5. The display device according to claim 1, wherein the display device is an organic electroluminescent display device.

6. A display device comprising:
    a pixel region;
    a power supply voltage line for providing a power supply voltage to the pixel region;
    a cathode supply voltage line for providing a cathode voltage to the pixel region;
    an electromagnetic field preventing and protecting circuit coupled to an input terminal of the power supply voltage line or the cathode supply voltage line to discharge signals having abnormal characteristics; and
    a circuit separation part for coupling the electromagnetic field preventing and protecting circuit to the input terminal, the circuit separation part having a width that is less in magnitude than a diameter of a laser beam used for repairing the electromagnetic field preventing and protecting circuit to facilitate electrical isolation of the electromagnetic field preventing and protecting circuit from the input terminal.

7. The display device according to claim 6, wherein the circuit separation part is formed as a neck having the width that is less in magnitude than the diameter of the laser beam.

8. The display device according to claim 7, wherein the circuit separation part is formed at a charge input line for coupling the electromagnetic field preventing and protecting circuit to the input terminal.

9. The display device according to claim 6, wherein the electromagnetic field preventing and protecting circuit includes a diode ring.

10. The display device according to claim 6, wherein the display device is an organic electroluminescent display device.

11. A display device comprising:
    a pixel region;
    a power supply voltage line for providing a power supply voltage to the pixel region;
    a cathode supply voltage line for providing a cathode voltage to the pixel region;
    an electromagnetic field preventing and protecting circuit coupled to an input terminal of the power supply voltage line or the cathode supply voltage line to discharge signals having abnormal characteristics; and
    a circuit separation part for coupling the electromagnetic field preventing and protecting circuit to the input terminal, said circuit separation part having a width that is substantially the same as a diameter of a laser beam used for repairing the electromagnetic field preventing and protecting circuit to facilitate electrical isolation of the electromagnetic field preventing and protecting circuit from the input terminal.

12. The display device according to claim 11, wherein the circuit separation part is formed as a neck having the width that is the same as the diameter of the laser beam.

13. The display device according to claim 11, wherein the electromagnetic field preventing and protecting circuit includes a diode ring.

14. The display device according to claim 11, wherein the display device is an organic electroluminescent display device.

15. A display device comprising:
    a pixel region;
    a power supply voltage line for providing a power supply voltage to the pixel region;
    a cathode supply voltage line for providing a cathode voltage to the pixel region;
    a signal line for transmitting data signals to the pixel region;
    an electromagnetic field preventing and protecting circuit coupled to an input terminal of the power supply voltage line, the cathode supply voltage line or the signal line to discharge charges accumulated on the input terminal; and
    a charge input line for coupling the electromagnetic field preventing and protecting circuit to the input terminal, the charge input line having a circuit separation part having a width narrower than that of the rest of the charge input line to facilitate electrical isolation of the electromagnetic field preventing and protecting circuit from the input terminal, the width of the circuit separation part being substantially equal to or smaller than a diameter of a laser beam used to decouple the electromagnetic field preventing and protecting circuit from the input terminal.

16. The display device according to claim 15, wherein the input charge line further comprises an edge part formed in an obtuse angle or an acute angle between the input terminal and the electromagnetic field preventing and protecting circuit to couple the charge input line to the electromagnetic field preventing and protecting circuit.

17. The display device according to claim 16, wherein the circuit separation part is coupled between the edge part and the input terminal.

18. The display device according to claim 15, wherein the display device is an organic electroluminescent display device.

19. The display device according to claim 15, wherein the electromagnetic field preventing and protecting circuit includes a diode ring.

20. The display device according to claim 15, wherein the input terminal includes a pair of input terminal sides, and wherein the electromagnetic field preventing and protecting circuit is coupled between the input terminal sides.

21. The display device according to claim 20, wherein the electromagnetic filed preventing and protecting circuit balances the charges between the input terminal sides.

* * * * *

UNITED STATES PATENT AND TRADEMARK OFFICE
CERTIFICATE OF CORRECTION

PATENT NO. : 7,372,680 B2
APPLICATION NO. : 10/972056
DATED : May 13, 2008
INVENTOR(S) : Mi-Sook Suh It is certified that error appears in the above-identified patent and that said Letters Patent is hereby corrected as shown below:

On the Title Page, Item:

(57) ABSTRACT, line 4         After "at", Insert --the--

(57) ABSTRACT, line 13        After "rated", Insert --.--

In the Claims

Column 10, line 9, Claim 21   Delete "filed", Insert --field--

Signed and Sealed this

Second Day of September, 2008

JON W. DUDAS
*Director of the United States Patent and Trademark Office*